(12) United States Patent
Chen et al.

(10) Patent No.: US 8,596,471 B2
(45) Date of Patent: Dec. 3, 2013

(54) MOUNTING BRACKET

(75) Inventors: Ken-Ching Chen, Kaohsiung Hsien (TW); I-Ming Tseng, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 307 days.

(21) Appl. No.: 12/889,779

(22) Filed: Sep. 24, 2010

(65) Prior Publication Data
US 2012/0074281 A1     Mar. 29, 2012

(51) Int. Cl.
*A47F 7/00*     (2006.01)

(52) U.S. Cl.
USPC ............. 211/26; 211/153; 211/187; 211/192; 248/222.11; 248/235; 248/323; 312/334.4; 312/334.5

(58) Field of Classification Search
USPC ................ 248/500, 323, 235, 239, 241, 244, 248/222.21; 312/334.4, 334.5, 223.1, 312/265.1; 211/26, 192, 187, 153; 411/71, 411/55, 171, 81
See application file for complete search history.

(56) References Cited

U.S. PATENT DOCUMENTS

| | | | |
|---|---|---|---|
| 5,833,337 A * | 11/1998 | Kofstad | 312/334.5 |
| 6,262,887 B1 * | 7/2001 | Lee | 361/679.27 |
| 6,347,042 B1 * | 2/2002 | White | 361/784 |
| 6,493,233 B1 * | 12/2002 | De Lorenzo et al. | 361/752 |
| 6,659,577 B2 | 12/2003 | Lauchner | |
| 6,702,124 B2 | 3/2004 | Lauchner et al. | |
| 6,830,300 B2 | 12/2004 | Lauchner | |
| 6,840,388 B2 | 1/2005 | Mayer | |
| 7,694,926 B2 | 4/2010 | Allen et al. | |
| 7,744,177 B2 | 6/2010 | Peng et al. | |
| 7,857,145 B2 * | 12/2010 | Mushan et al. | 211/26 |
| 8,104,626 B2 * | 1/2012 | Huang et al. | 211/26 |

\* cited by examiner

*Primary Examiner* — Amy Sterling
(74) *Attorney, Agent, or Firm* — Rosenberg, Klein & Lee

(57) ABSTRACT

A mounting bracket includes an end plate perpendicularly extending from a side plate and having an elongate hole. A pin assembly includes a pin, a protrusion and a fixing member, wherein the pin is connected to the protrusion and contacts the end plate. The protrusion is located in and movable in the elongate hole. The thickness of the protrusion is larger than that of the end plate. The fixing member includes a head and a shank extending from the head. The shank connects the pin and the protrusion. By this arrangement, the fixing member and the pin clamps the protrusion to be movably engaged with the elongate hole. The pin is adjustably moved in the elongate hole by the protrusion in the elongate hole of the end plate.

7 Claims, 7 Drawing Sheets

MOUNTING BRACKET

FIELD OF THE INVENTION

The present invention relates to a mounting bracket, and more particularly, to a mounting bracket which is connected to a rail and adjustably connected to a support column of an equipment rack by a pin assembly of the mounting bracket.

BACKGROUND OF THE INVENTION

U.S. Pat. No. 7,694,926 to Allen et al discloses a mounting bracket 200 which includes a base member 202 with a side plate 204 and an end plate 206 connected to the side plate 204. Two pins 210 are connected to the end plate 206. A four-rack equipment rack 100 includes four vertical support columns 104 which are arranged as a square and each vertical support column 104 includes a plurality of holes 208. When assembling, two mounting brackets are respectively connected to two ends of the rail and each mounting bracket has two pins which extend through the holes in the vertical support columns of the equipment rack, such that the rail is connected to the equipment rack. When the two rails are correspondingly connected to the equipment rack, a rack-mount module 102 can be attached to the rails and pulled out from the equipment rack or received in the equipment rack.

However, when the distance between the holes in the vertical support columns on two sides of the equipment rack includes a larger tolerance which causes the combination width of the mounting brackets, rails and rack-mount module cannot match with the real distance, because the pins on the mounting brackets are engaged with the holes in the vertical support columns of the equipment rack with only very small gap which is not allowed to be adjusted in a lateral direction. Therefore, the installation is difficult and even cannot be finished. The rails will have significant resistance even drop from the equipment rack. Besides, when rack-mount module has small tolerance, the pins on the mounting brackets cannot be properly adjusted to complete the installation.

Furthermore, U.S. Pat. Nos. 7,744,177, 6,840,388, 6,830,300, 6,702,124, and 6,659,577 disclose the pins cooperated with the mounting brackets and all of the prior patents are cited for reference.

The present invention intends to provide a mounting bracket which improves the shortcomings of the conventional mounting brackets.

SUMMARY OF THE INVENTION

The present invention relates to a mounting bracket which comprises a side plate and an end plate extending perpendicularly from an end of the side plate. The end plate has an elongate hole. A pin assembly comprises a pin, a protrusion and a fixing member, wherein the pin has a connection hole. The protrusion is located corresponding to the elongate hole of the end plate and the thickness of the protrusion is larger than that of the end plate. The fixing member has a head and a shank extending from the head. The head of the fixing member and the pin are longitudinally located on two sides of the end plate. The shank is connected to the connection hole of the pin and the protrusion is located between the head of the fixing member and the pin. The protrusion is movable within elongate hole of the end plate.

Preferably, the protrusion extends from an end of the pin.

Preferably, the mounting bracket further comprises a connection plate and at least two pins connected to the connection plate.

Preferably, the protrusion has a hole which is located corresponding to the connection hole of the pin.

Preferably, the protrusion is integrally connected with the fixing member and extends from the head of the fixing member.

Preferably, the periphery of the head of the fixing member extends beyond the elongate hole of the end plate.

Preferably, the fixing member includes a washer whose periphery extends beyond the elongate hole of the end plate.

The primary object of the present invention is to provide a mounting bracket which has at least one pin that is transversely adjustable so as to be easily installed to an equipment rack.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
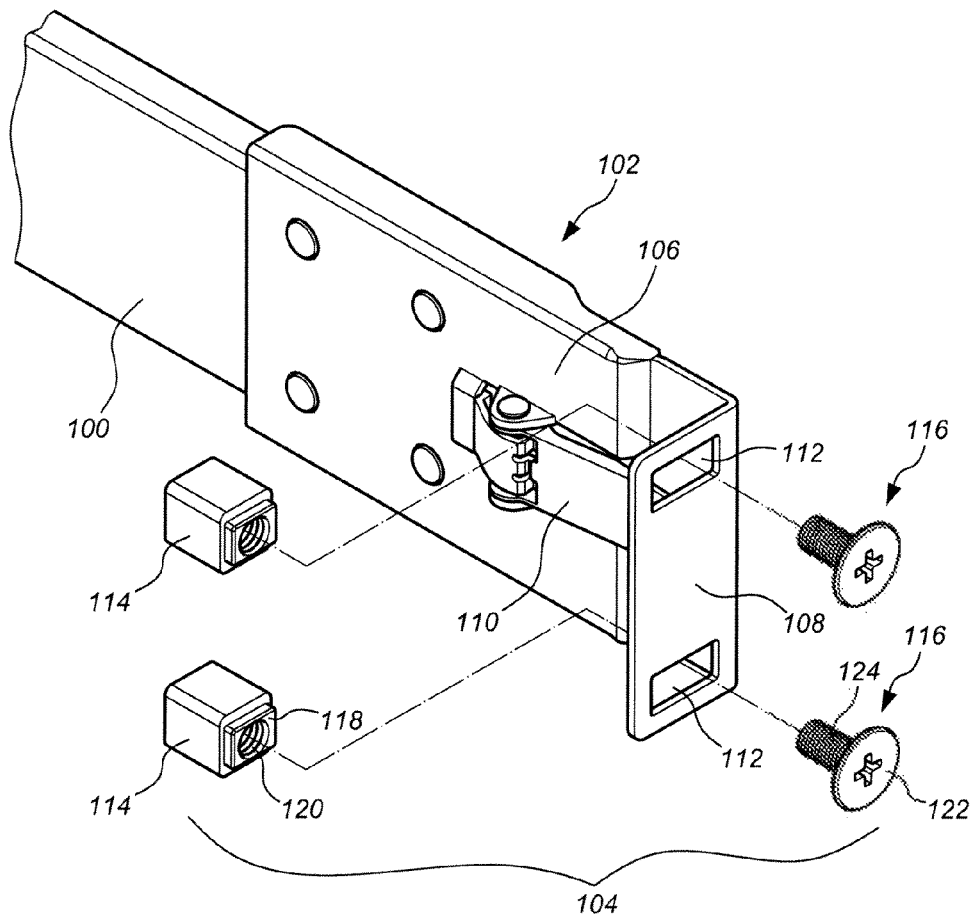
FIG. 1 is an exploded view to show the mounting bracket of the present invention.

Referring to FIG. 1, the first embodiment of the present invention comprises a rail 100, a mounting bracket 102 connected to an end of the rail 100, and a pin assembly 104 connected to the mounting bracket 102. The mounting bracket 102 comprises a side plate 106 and an end plate 108 extending substantially perpendicularly from an end of the side plate 106. A stop 110 is connected to the side plate 106 of the mounting bracket 102 and extends toward the end plate 108. The side plate 106 is connected to the rail 100 and the end plate 108 has two elongate holes 112. The pin assembly 104 comprises two sets of parts so as to be located corresponding to the two elongate holes 112 of the end plate 108. Each set of parts comprises a pin 114, a fixing member 116 and a protrusion 118 located between the pin 114 and the fixing member 116. The pin 114 has a connection hole 120 such as a threaded hole. The fixing member 116 comprises a head 122 and a shank 124 extending from the head 122. The head 122 has a recess such as a Phillips recess or a cabinet recess for a screw driver to be engaged therewith. The shank 124 can be a threaded shank so as to be connected to the connection hole 120 of the pin 114. The protrusion 118 is located corresponding to the connection hole 120 of the pin 114 and forms a rectangular body. In this embodiment, the protrusion 118 extends from an end of the pin 114.

Figure 2:
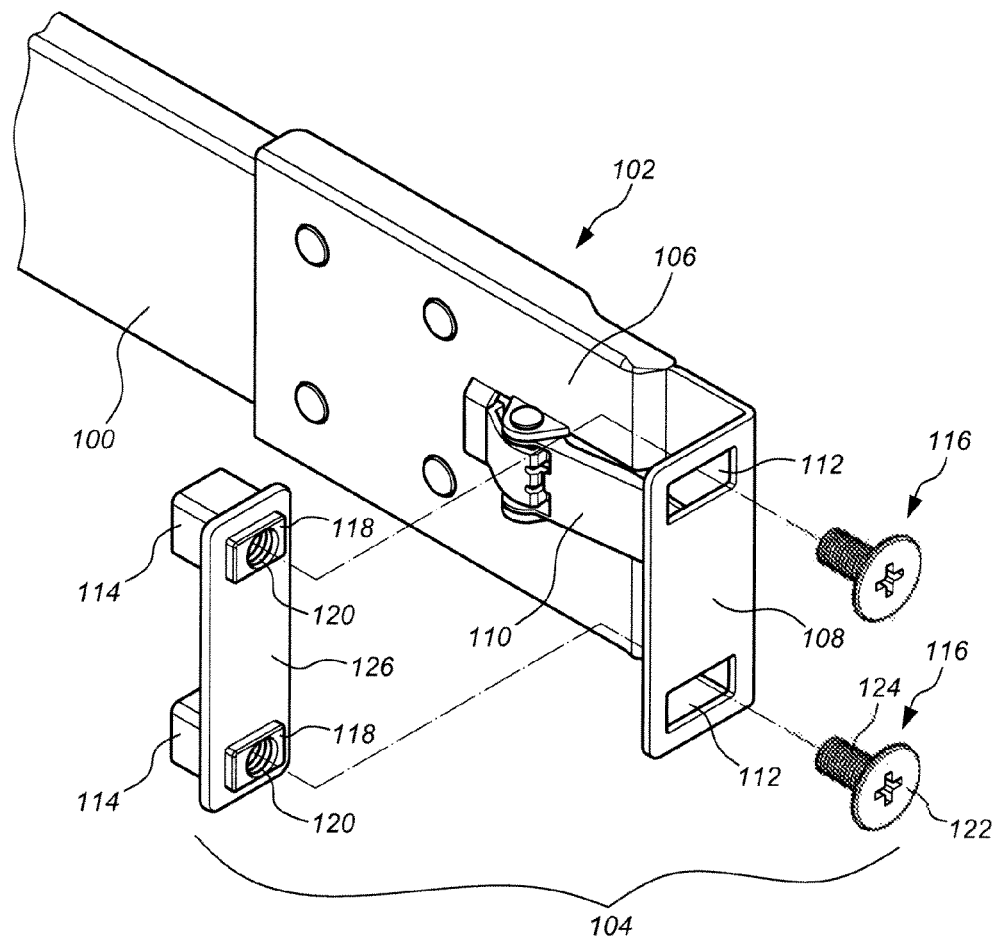
FIG. 2 is an exploded view to show that the pin assembly of the mounting bracket of the present invention includes a connection plate.

FIG. 2 shows that a connection plate 126 is connected between the two pins 114 to form an integral part. In this embodiment, the two pins 114, the two protrusions 118 and the connection plate 126 are integrally form as a one piece.

Figure 3:
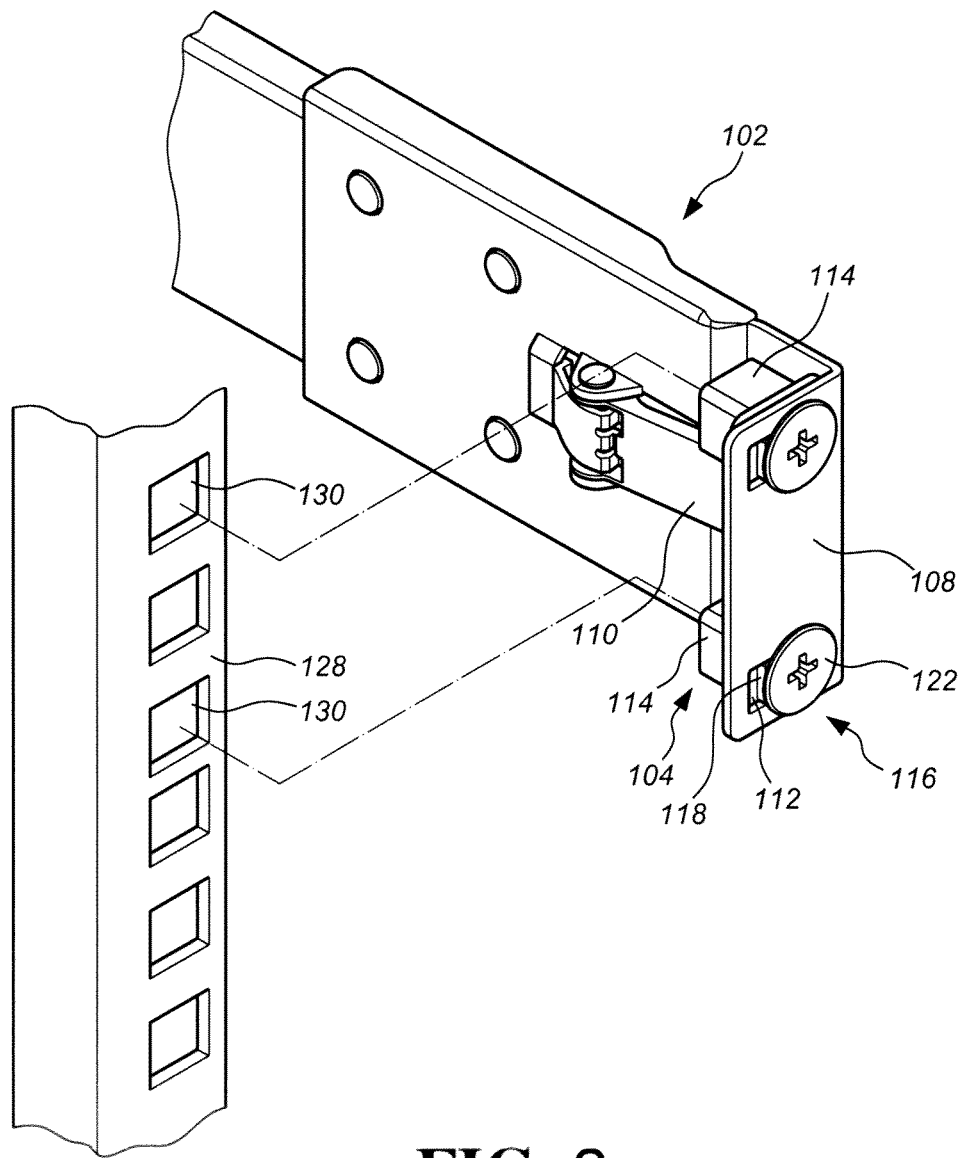
FIG. 3 is an exploded view to show the mounting bracket of the present invention and a vertical support column.

FIG. 3 shows the combination of the pin assembly 104, wherein the pin 114 and the fixing member 116 are longitudinally located on two sides of the end plate 108. The protrusion 118 is located within the elongate hole 112 of the end plate 108 and connected to the pin 114 by the fixing member 116. The protrusion 118 is located between the head 122 of the fixing member 116 and the pin 114. The periphery of the head 122 of the fixing member 116 extends beyond the elongate hole 112 of the end plate 108. A vertical support column 128 has a plurality of holes 130. When the pin assembly 104 is connected to the vertical support column 128, the two pins 114 of the pin assembly 104 are located corresponding to the two holes 130 of the vertical support column 128.

Figure 4:
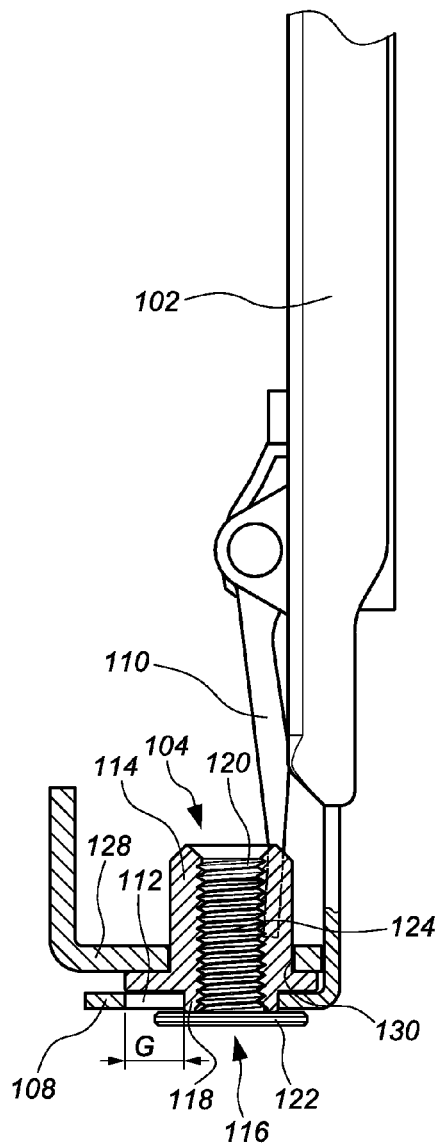
FIG. 4 is a cross sectional view to show that the mounting bracket is connected to the vertical support column.

FIG. 4 further discloses the pin assembly 104 is connected to the holes 130 of the vertical support column 128 by the pins 114. By the contact between the stop 110 on the mounting bracket 102 and the vertical support column 128, the pin 114 cannot be disengaged from the hole 130 of the vertical support column 128 in a longitudinal direction. The pin assembly 104 is engaged with the elongate hole 112 of the end plate 108 of the mounting bracket 102 by the protrusion 118, and the elongate hole 112 provides a space "G" for transverse movement of the protrusion 118 in the elongate hole 112. The thickness of the protrusion 118 is larger than that of the end plate 108. Therefore, when the shank 124 passes through the protrusion 118 and is connected to the connection hole 120 of the pin 114, the head 122 of the fixing member 116 is in contact with the protrusion 118 and does not contact the end plate 108 so as to ensure that the pin 114 is movable in the elongate hole 112 of the end plate 108 by the protrusion 118.

Figure 5:
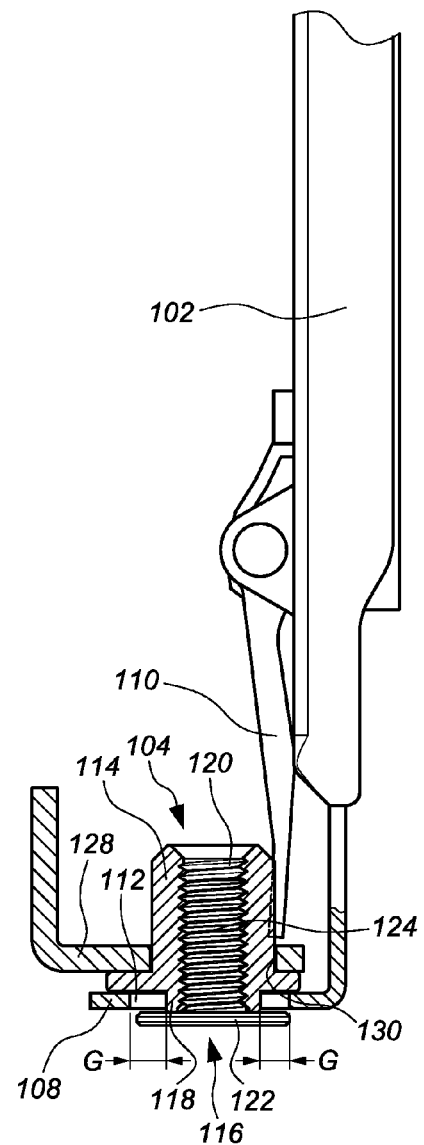
FIG. 5 shows the adjusted status related to the mounting bracket and the vertical support column.

The pin 114 of the pin assembly 104 is engaged with the hole 130 of the vertical support column 128 and only very small gap is provided, so that we assume there is no relative shaft between the pin 114 and the hole 130. As shown in FIG. 5, the pin assembly 104 has a special feature, when the vertical support column 128 is stationary and assumes as a base, the pin 114 engaged with the hole 130 of the vertical support column 128 is stationary. The rail 100 and the mounting bracket 102 can be properly adjusted by the space "G" between the elongate hole 112 of the end plate 108 and the protrusion 118. Similarly, when the rail 100 and the mounting bracket 102 are assumed to be stationary base, if the vertical support column 128 slightly shifts, by the pin 114 being movable in the elongate hole 112 of the end plate 108 by the protrusion 118 to ensure that the pin 114 is engaged with the hole 130 of the vertical support column 128.

Figure 6:
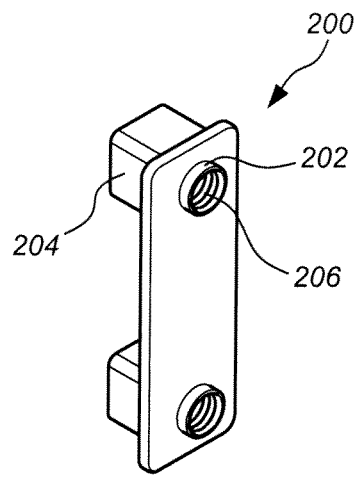
FIG. 6 shows the second embodiment of the pin assembly of the present invention.

FIG. 6 shows that the protrusion 202 of the pin assembly 200 is a cylindrical member which extends from an end of the pin 204 and is located corresponding to the connection hole 206.

Figure 7:
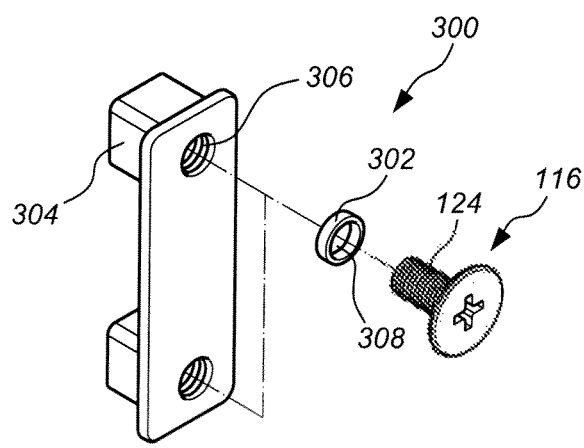
FIG. 7 shows the third embodiment of the pin assembly of the present invention.

FIG. 7 shows that the pin assembly 300 includes two individual protrusion 302 and pin 304, the protrusion 302 has a hole 308 which is located corresponding to the connection hole 306 of the pin 304. The shank 124 of the fixing member 116 extends through the hole 308 of the protrusion 302 and is connected to the connection hole 306 of the pin 304.

Figure 8:
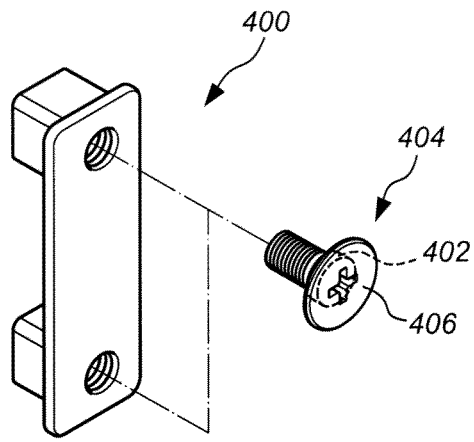
FIG. 8 shows the fourth embodiment of the pin assembly of the present invention.

FIG. 8 shows that the protrusion 402 of the pin assembly 400 is integrally connected with the fixing member 404 and extends from the head 406 of the fixing member 404.

Figure 9:
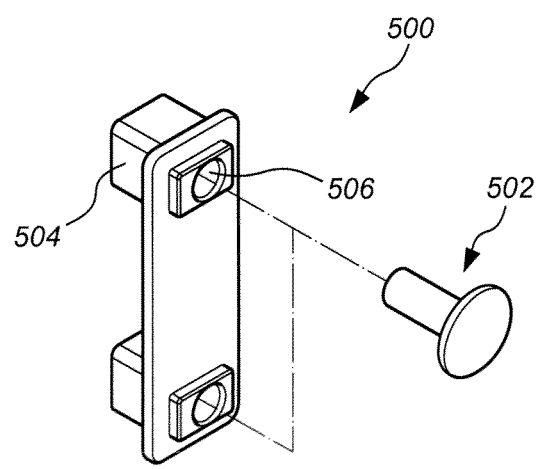
FIG. 9 shows the fifth embodiment of the pin assembly of the present invention.

FIG. 9 shows that the fixing member 502 of the pin assembly 500 is a rivet which connects the pin 504 to the connection hole 506.

Figure 10:
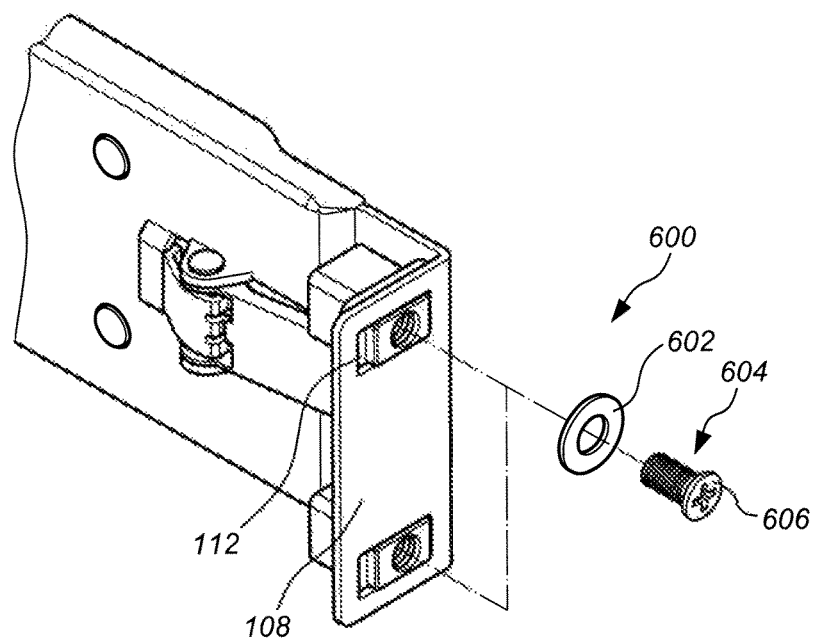
FIG. 10 shows the sixth embodiment of the pin assembly of the present invention.

FIG. 10 shows that the pin assembly 600 includes a washer 602 connected to the fixing member 604 and the periphery of the washer 602 extends beyond the elongate hole 112 of the end plate 108. By the arrangement, even if the head 606 of the fixing member 604 is smaller, the head 606 can contact the end plate 108 of the mounting bracket 102 by the washer 602.

While we have shown and described the embodiment in accordance with the present invention, it should be clear to those skilled in the art that further embodiments may be made without departing from the scope of the present invention.

What is claimed is:

1. A mounting bracket for attachment to a support column, the mounting bracket comprising a side plate and an end plate extending perpendicularly from an end of the side plate, the end plate having an elongate hole formed therein and at least one pin assembly, the pin assembly comprising:
    a pin configured to engage a corresponding hole of the support column, the pin having a connection hole formed therein;
    a protrusion located corresponding to the elongate hole of the end plate, a thickness of the protrusion being larger than that of the end plate; and
    a fixing member having a head and a shank extending from the head, the fixing member extending in a longitudinal direction through the elongate hole;
    wherein the head of the fixing member and the pin are located on opposing sides of the end plate, the shank of the fixing member is connected to the connection hole of the pin to releasably affix the pin and protrusion to the end plate at an adjusted position, the protrusion is located between the head of the fixing member and the pin, and the protrusion extending longitudinally to slidably engage the elongate hole, the protrusion being thereby displaceable for adjustment transversely along the elongate hole relative to the longitudinal direction for alignment with the corresponding hole of the support column.

2. The mounting bracket as claimed in claim 1, wherein the protrusion extends from an end of the pin.

3. The mounting bracket as claimed in claim 1, further comprising a connection plate and at least two pins are connected to the connection plate.

4. The mounting bracket as claimed in claim 1, wherein the protrusion has a hole which is located corresponding to the connection hole of the pin.

5. The mounting bracket as claimed in claim 1, wherein the protrusion is integrally connected with the fixing member and extends from the head of the fixing member.

6. The mounting bracket as claimed in claim 1, wherein a periphery of the head of the fixing member extends beyond the elongate hole of the end plate.

7. The mounting bracket as claimed in claim 1, wherein the fixing member includes a washer whose periphery extends beyond the elongate hole of the end plate.

* * * * *